(12) United States Patent
Chen et al.

(10) Patent No.: US 8,058,561 B2
(45) Date of Patent: Nov. 15, 2011

(54) CIRCUIT BOARD AND MANUFACTURING METHOD THEREOF

(75) Inventors: Chun-Chien Chen, Taipei County (TW); Tsung-Yuan Chen, Taouyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 689 days.

(21) Appl. No.: 12/193,460

(22) Filed: Aug. 18, 2008

(65) Prior Publication Data

US 2009/0205852 A1   Aug. 20, 2009

(30) Foreign Application Priority Data

Feb. 19, 2008   (TW) ................................ 97105787 A

(51) Int. Cl.
*H05K 1/11* (2006.01)

(52) U.S. Cl. ........ 174/254; 174/258; 174/263; 174/264; 174/261; 361/708; 361/719; 361/795; 257/698; 257/758; 257/774; 428/209; 428/131; 29/829; 29/830; 29/846; 29/852

(58) Field of Classification Search .......... 174/250–266, 174/524; 361/708, 712, 719–722, 790–795, 361/803; 257/706–712, 698, 676, 758, 774; 428/131, 209, 626, 458, 337, 901, 106–118; 29/829–834, 842–854
See application file for complete search history.

(56) References Cited

U.S. PATENT DOCUMENTS

| | | | | |
|---|---|---|---|---|
| 4,997,698 | A | * | 3/1991 | Oboodi et al. ................. 428/209 |
| H1471 | H | * | 8/1995 | Braun et al. ................... 361/704 |
| 5,544,773 | A | * | 8/1996 | Haruta et al. ................... 216/13 |
| 5,879,787 | A | * | 3/1999 | Petefish .......................... 428/209 |
| 6,180,261 | B1 | * | 1/2001 | Inoue et al. .................... 428/626 |
| 6,344,371 | B2 | * | 2/2002 | Fischer et al. ................. 438/106 |
| 6,420,018 | B1 | * | 7/2002 | Inoue et al. .................... 428/209 |
| 6,653,572 | B2 | * | 11/2003 | Ishiwa et al. ................... 174/250 |
| 6,767,616 | B2 | * | 7/2004 | Ooi et al. ........................ 428/209 |
| 6,867,491 | B2 | * | 3/2005 | Guzek et al. ................... 257/698 |
| 2003/0180510 | A1 | | 9/2003 | Ogawa et al. |
| 2005/0025944 | A1 | | 2/2005 | Ogawa et al. |

FOREIGN PATENT DOCUMENTS

| | | |
|---|---|---|
| CN | 1728920 | 2/2006 |
| CN | 1258308 | 5/2006 |
| JP | 2000-114720 | 4/2000 |
| JP | 02001332828 A | * 11/2001 |
| JP | 2003-069235 | 3/2003 |

OTHER PUBLICATIONS

Chinese First Examination Report of China Application No. 200810082126.2, dated Aug. 3, 2010.

* cited by examiner

*Primary Examiner* — Michail V Datskovskiy
(74) *Attorney, Agent, or Firm* — J.C. Patents

(57) ABSTRACT

A manufacturing method of a circuit board is provided. A metal core is provided. A conductive layer is formed on each of some carriers. The carriers and dielectric layers are laminated at both sides of the metal core to form a stacked structure. Each of the dielectric layers is located between the corresponding carrier and the metal core, and a portion of the conductive layer is embedded in the corresponding dielectric layer. Then, the carriers are removed. A blind via and/or a through via are/is formed in the stacked structure to connect the corresponding conductive layer and the metal core and/or connect the conductive layers at both sides of the metal core, wherein the through via penetrates the metal core. The conductive layer on a surface of the dielectric layer is removed.

10 Claims, 6 Drawing Sheets

CIRCUIT BOARD AND MANUFACTURING METHOD THEREOF

CROSS-REFERENCE TO RELATED APPLICATION

This application claims the priority benefit of Taiwan application serial no. 97105787, filed on Feb. 19, 2008. The entirety of the above-mentioned patent application is hereby incorporated by reference herein and made a part of specification.

BACKGROUND OF THE INVENTION

1. Field of the Invention

The present invention is related to a circuit board and a method of manufacturing the same, and particularly to a circuit board having an odd number of circuit layers and a manufacturing method thereof.

2. Description of Related Art

As the electronic technology advances rapidly and the high-technology electronic industry continues burgeoning in recent years, electronic products with more human touch and better functions keep hitting the market and developing towards the trend of light weight, slimness, and tiny and compact size. Inside these electronic products are usually disposed circuit boards having conductive circuits.

For those conventional circuit boards, the manufacturing method thereof usually includes forming a first conductive layer at both sides of a core layer. Afterwards, each of the first conductive layers is patterned to form a first circuit layer. Then, two dielectric layers and two second conductive layers are laminated respectively at the both sides of the core layer by lamination so that the dielectric layers are laminated between the core layer and the second conductive layer. Next, openings are formed in the second conductive layer and the dielectric layers respectively to expose the first circuit layers. Then, an copper electroplating process is performed to form a conductive via in each of the openings. Thereafter, each of the second conductive layers is patterned to form a second circuit layer on the dielectric layer, and the second circuit layers are connected to the first circuit layers through the conductive vias. Certainly, more circuit layers may be formed in the same way to fulfill actual requirements.

Since circuit layers are sequentially formed at the both sides of the core layer symmetrically, the circuit board thus manufactured has an even number of circuit layers. However, the aforementioned manufacturing method often limits the scope of freedom for circuit design, which means that circuit boards to be thereby manufactured must have an even number of circuit layers. In addition, some circuit boards do not require using an even number of circuit layers. Therefore, the said manufacturing method often results in redundant circuit layers in the circuit boards and thereby causes waste in manufacturing costs.

SUMMARY OF THE INVENTION

In view of the foregoing, the present invention is directed to a manufacturing method of a circuit board. The manufacturing method can avoid forming redundant circuit layers so as to reduce manufacturing costs.

The present invention is also directed to a circuit board capable of having an odd number of circuit layers.

The present invention provides a manufacturing method of a circuit board. In the method, a metal core is provided first. Afterwards, on each of a plurality of carriers is formed a first conductive layer. Next, these carriers and a plurality of dielectric layers are laminated at both sides of the metal core to form a stacked structure. Each of the dielectric layers is located between the corresponding carrier and the metal core. A portion of the first conductive layer is embedded in the corresponding dielectric layer. Then, the carriers are removed. Later, a blind via and/or a through via are/is formed in the stacked structure to connect with the corresponding first conductive layer and the metal core and/or connect with the first conductive layer located at the both sides of the metal core. The through via penetrates the metal core. Thereafter, the first conductive layer on a surface of the dielectric layer is removed.

According to the manufacturing method of the circuit board in an embodiment of the present invention, a method of forming the blind via includes forming a blind via opening in the stacked structure first, for example. The blind via opening exposes the metal core. Later, a second conductive layer is filled into the blind via opening.

According to the manufacturing method of the circuit board in an embodiment of the present invention, the blind via opening is formed by a laser drilling process or a mechanical drilling process, for example. According to the manufacturing method of the circuit board in an embodiment of the present invention, the method of forming the blind via opening includes forming a blind via opening in the stacked structure first, for example. The blind via opening exposes the metal core. Afterwards, the second conductive layer is formed on a surface of the blind via opening. Next, a via filler is filled into the blind via opening. According to the manufacturing method of the circuit board in an embodiment of the present invention, the method of forming the through via includes, for example, forming a through via opening in the stacked structure first. The through via opening penetrates the metal core. Next, the second conductive layer is filled into the through via opening.

According to the manufacturing method of the circuit board in an embodiment of the present invention, the through via opening is formed by a laser drilling process or a mechanical drilling process, for example.

According to the manufacturing method of the circuit board in an embodiment of the present invention, the method of forming the through via includes forming a through via opening in the stacked structure first, for example. The through via opening penetrates the metal core. Afterwards, the second conductive layer is formed on a surface of the through via opening. Then, a via filler is filled into the through via opening.

According to the manufacturing method of the circuit board in an embodiment of the present invention, a core opening is formed by an etching process, for example.

According to the manufacturing method of the circuit board in an embodiment of the present invention, a core opening may be further formed in the metal core. The core opening penetrates the metal core, and the through via penetrates the core opening in the subsequent process.

A circuit board including a stacked structure and a conductive via is further provided in the present invention. The stacked structure includes a metal core, a pair of conductive layers and a pair of dielectric layers. The conductive layers are disposed at both sides of the metal core. The dielectric layer is disposed between the corresponding conductive layer and the metal core. The conductive layer is embedded in the corresponding dielectric layer. The conductive via is disposed in the stacked structure to connect with the corresponding conductive layer and the metal core and/or penetrates the metal core to connect with the conductive layer at the both sides of the metal core.

According to the circuit board in an embodiment of the present invention, the conductive via is a blind via, for example. The blind via is connected to the corresponding conductive layer and the metal core.

According to the circuit board in an embodiment of the present invention, the conductive via is a through via, for example. The through via penetrates the metal core to connect with the conductive layer at the both sides of the metal core.

According to the circuit board in an embodiment of the present invention, a material of the metal core is metal or alloy, for example.

According to the circuit board in an embodiment of the present invention, a thickness of the metal core is between 0.02 mm and 0.8 mm, for example.

According to the circuit board of an embodiment of the present invention, a material of the conductive layer is copper, for example.

According to the circuit board in an embodiment of the present invention, a thickness of the conductive layer is between 5 μm and 30 μm, for example.

According to the circuit board in an embodiment of the present invention, a material of the dielectric layer is dielectric resin, for example.

According to the circuit board in an embodiment of the present invention, a material of the conductive via is copper, for example.

According to the circuit board in an embodiment of the present invention, the metal core has a core opening. The core opening penetrates the metal core and the conductive via penetrates the core opening.

In the present invention, the metal board is used as a core layer in the circuit board first. Then, a circuit layer is simultaneously formed at both sides of the metal core by lamination. A circuit board having an odd number of circuit layers is thus constituted, which avoids forming redundant circuit layers and thereby reduces manufacturing costs.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
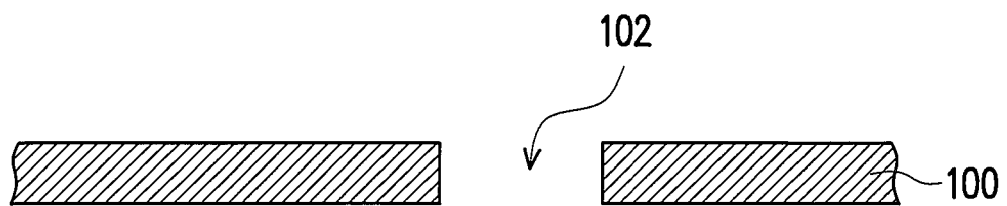
FIGS. 1A through 1E are schematic cross-sectional views illustrating a process flow of a circuit board according to an embodiment of the present invention.

FIGS. 1A through 1E are schematic cross-sectional views illustrating a process flow of a circuit board according to an embodiment of the present invention. Referring to FIG. 1A, a metal core 100 is provided first. In addition, a core opening 102 may be further optionally formed in the metal core 100 and the core opening 102 penetrates the metal core 100. The core opening 102 is formed by an etching process, for example. A material of the metal core 100 is, for example, metal or alloy, and a thickness of the metal core 100 is between 0.02 mm and 0.8 mm. In the present embodiment, the material of the metal core 100 is copper.

Figure 1B:
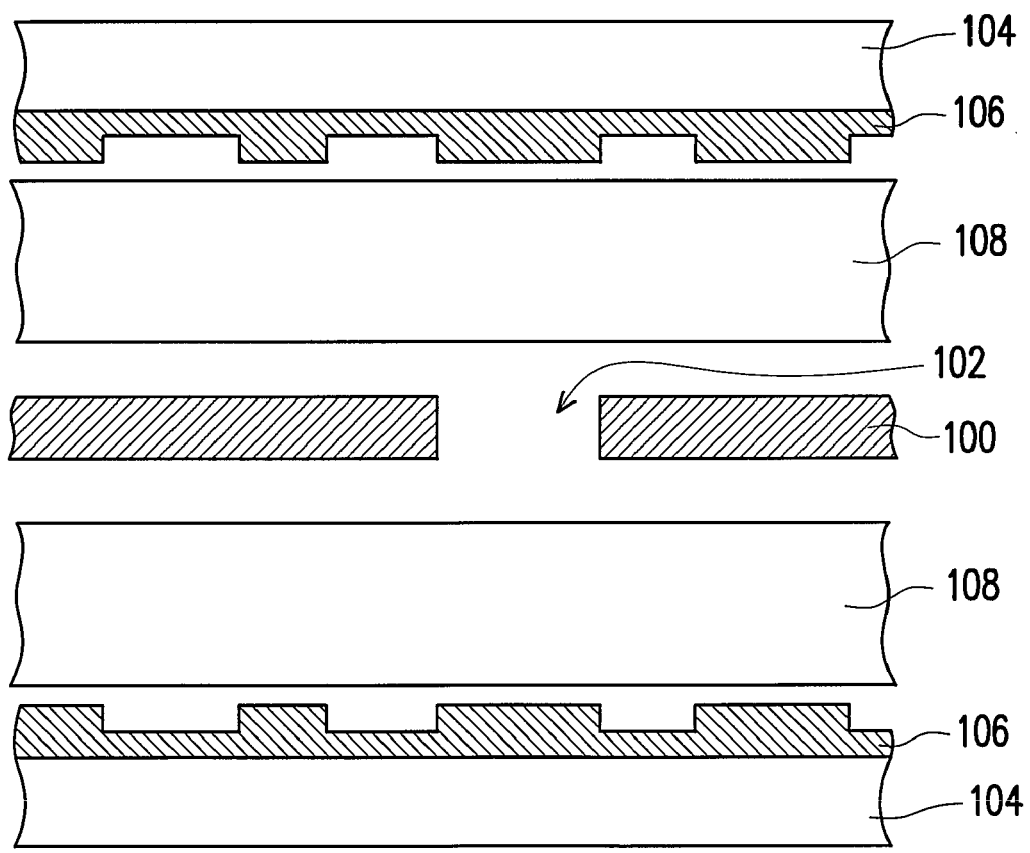

Afterwards, referring to FIG. 1B, a plurality of carriers 104 is provided and a conductive layer 106 is formed on each of the carriers 104. A material of the conductive layer 106 is copper, for example. A method of forming the conductive layer 106 includes forming a conductive material layer on the carrier 104 first and then performing a patterning process thereon. A thickness of the conductive layer 106 is between 5 μm and 30 μm, for example. Furthermore, a plurality of dielectric layers 108 is provided. A material of the dielectric layer 108 is dielectric resin, for example.

Figure 1C:
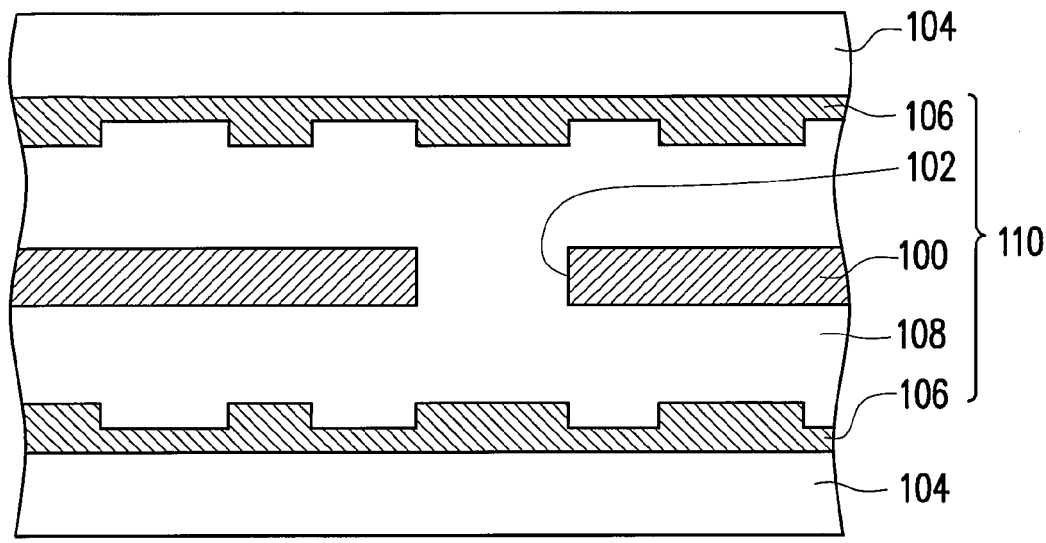

Next, referring to FIG. 1C, the carriers 104 and the dielectric layers 108 are laminated at both sides of the metal core 100 to form a stacked structure 110. In the stacked structure 110, the dielectric layers 108 is located between the corresponding carrier 104 and the metal core 100. A portion of the conductive layer 106 is embedded in the corresponding dielectric layer 108. Specifically, the first conductive layer 106, the first dielectric layer 108, the metal core 100, the second dielectric layer 108 and the second conductive layer 106 are stacked in sequence from top to bottom in the stacked structure 110.

Figure 1D:
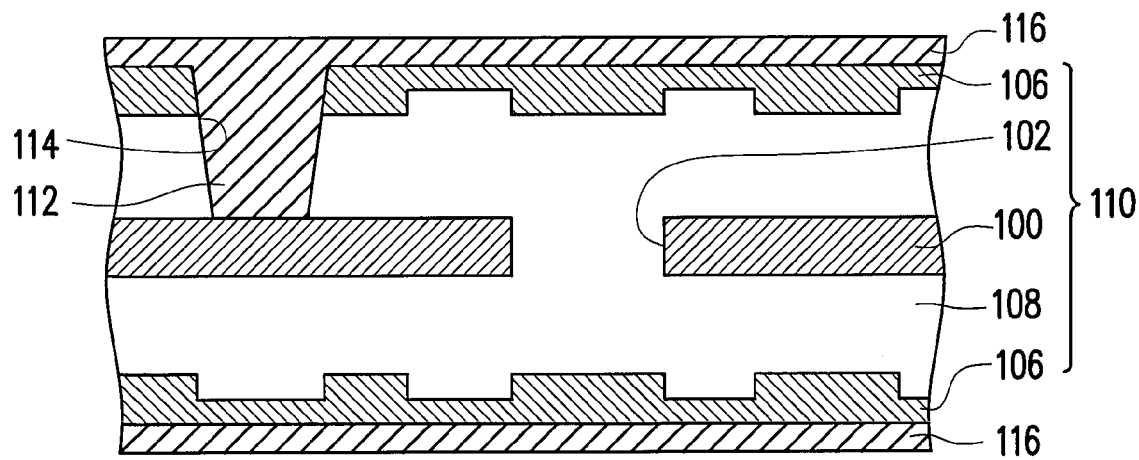

Referring to FIG. 1D, the carrier 104 is removed. Then, a conductive via is formed in the stacked structure 110. In the present embodiment, the conductive via is a blind via 112 connecting the upper conductive layer 106 and the metal core 100. A method of forming the blind via 112 is first forming a blind via opening 114 which exposes the metal core 100 in the stacked structure 110 and then performing an electroplating process at both sides of the stacked structure 110 to fill a portion of the conductive layer 116 into the blind via opening 114. A material of the conductive layer 116 is copper, for example. Additionally, the blind via opening 114 is formed by a laser drilling process or a mechanical drilling process, for example.

Figure 1E:
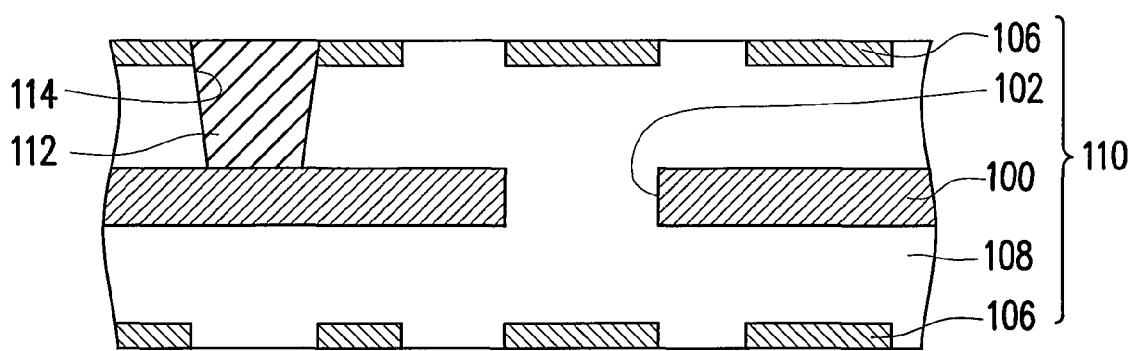

Afterwards, referring to FIG. 1E, the conductive layers 106 and 116 on both surfaces of the dielectric layer 108 are removed to form a circuit board having three circuit layers. The three circuit layers are the metal core 100 and the conductive layers 106 respectively disposed over both sides of the metal core 100.

It is to be noted that in the present embodiment, the blind via 112 is formed by filling up the blind via opening 114 with the portion of the conductive layer 116. In another embodiment of the present invention, the blind via may also be formed by a conductive layer formed on a sidewall of the blind via opening 114.

Figure 2A:
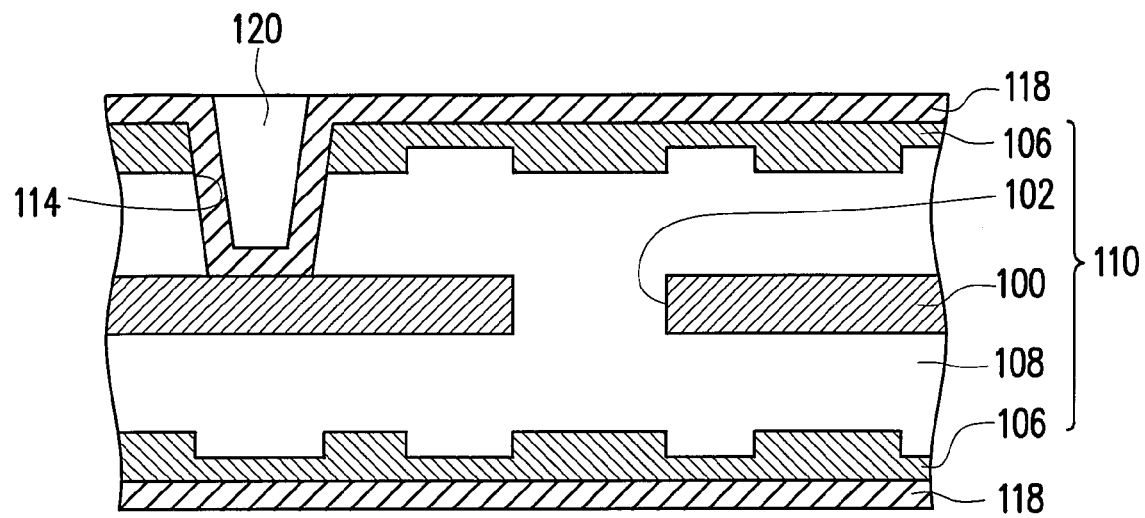
FIGS. 2A and 2B are schematic cross-sectional views illustrating a process flow of a circuit board according to another embodiment of the present invention.
Figure 2B:
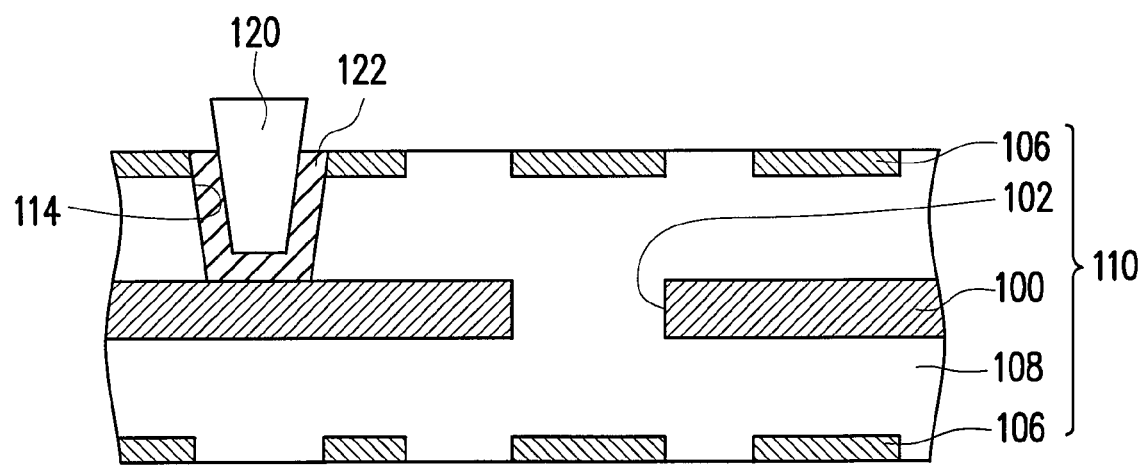

FIGS. 2A and 2B are schematic cross-sectional views illustrating a process flow of a circuit board according to another embodiment of the present invention. First, referring to FIG. 2A, the carrier 104 is removed after the stacked structure 110 in FIG. 1C is formed. Afterwards, the blind via opening 114 is formed which exposes the metal core 100 in the stacked structure 110. The blind via opening 114 is formed by a laser drilling process or a mechanical drilling process, for example. Next, an electroplating process is performed at both sides of the stacked structure 110 to conformally form conductive layers 118 on both surfaces of the stacked structure 110. A material of the conductive layer 118 is copper, for example. In other words, in the blind via opening 114, the conductive layer 118 is only formed on a surface of the blind via opening 114 and a surface of a portion of the metal core 100. Thereafter, a via-filling material is filled into the blind via opening 114 to form a via filler 120. A material of the via filler 120 is dielectric resin, for example.

Then, referring to FIG. 2B, the conductive layers 106 and 118 on surfaces of the dielectric layer 108 are removed to form a blind via 122 which connects the conductive layer 106 and the metal core 100. Thus, the manufacturing of a circuit board having three circuit layers is completed. In an embodiment not illustrated herein, a protrusion of the via filler 120 may be removed by mould-brushing process.

In the foregoing two-embodiments of the present invention, the circuit board has a blind via which connects the conductive layer 106 with the metal core 100. Certainly, in the other embodiments, the conductive vias in the metal core 100 may also be through vias which connect the conductive layers 106 respectively disposed at the both sides of the metal core 100.

Figure 3A:
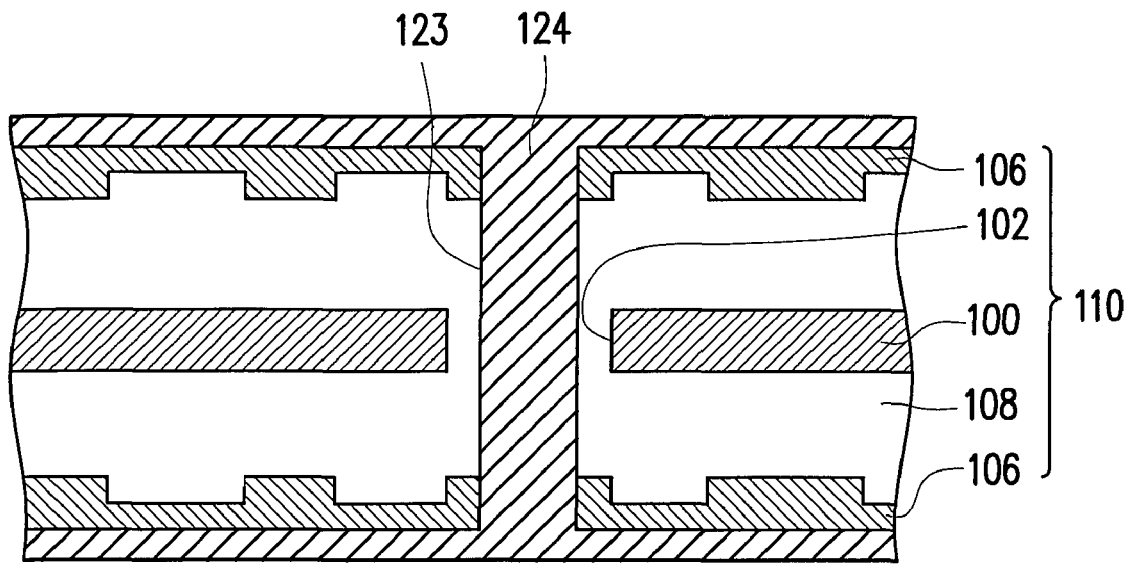
FIGS. 3A and 3B are schematic cross-sectional views illustrating a process flow of a circuit board according to yet another embodiment of the present invention.
Figure 3B:
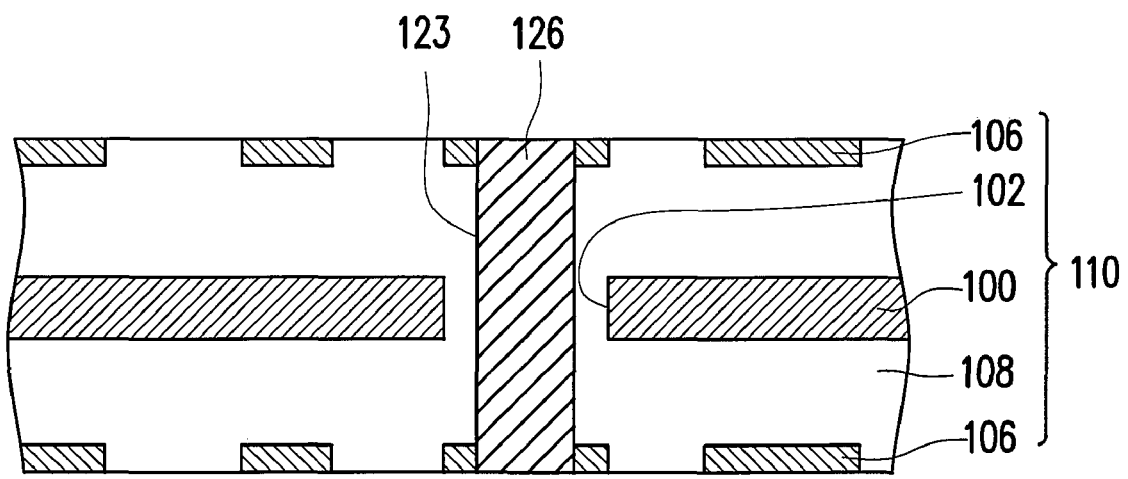

FIGS. 3A and 3B are schematic cross-sectional views illustrating a process flow of a circuit board according to another embodiment of the present embodiment. Referring to FIG. 3A, after the stacked structure 110 in FIG. 1C is formed, the carrier 104 is removed first. Then, a through via opening 123 which penetrates the metal core 100 is formed in the stacked structure 110. The through via opening 123 is formed by a laser drilling process or a mechanical drilling process, for example. In the present embodiment, the through via opening 123 penetrates the core opening 102. Certainly, in the other embodiments not shown, the through via opening 123 may also penetrate the other positions in the metal core 100, instead of the core opening 102. Thereafter, an electroplating process is performed at the both sides of the stacked structure 110 to fill a conductive layer 124 in the through via opening 123. A material of the conductive layer 124 is copper, for example.

Referring to FIG. 3B, the conductive layers 106 and 124 on surfaces of the dielectric layers 108 are removed to form a through via 126 connecting the conductive layers 106 respectively disposed at the both sides of the metal core 100. Thus, the manufacturing of a circuit board having three circuit layers is completed.

Similarly, in the present embodiment, the through via 126 is formed by the conductive layer 124 filling up the through via opening 123. In another embodiment of the present invention, the through via may also be formed by a conductive layer formed on a sidewall of the through via opening 123.

Figure 4A:
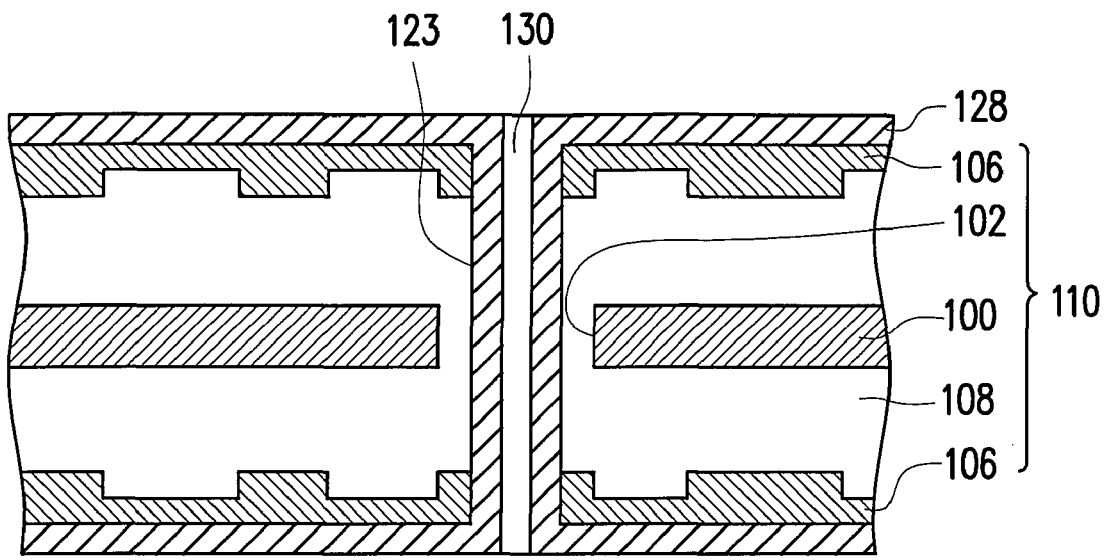
FIGS. 4A and 4B are schematic cross-sectional views illustrating a process flow of a circuit board according to still another embodiment of the present invention.
Figure 4B:
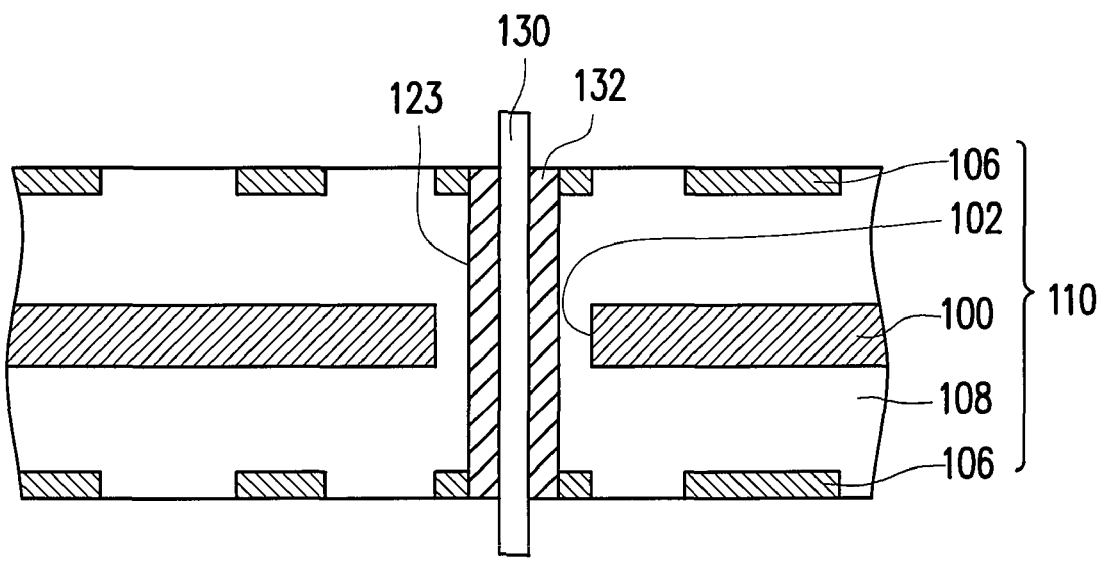

FIGS. 4A and 4B are schematic cross-sectional views illustrating a process flow of a circuit board according to yet another embodiment of the present invention. Referring to FIG. 4A, first, the carrier 104 is removed after the stacked structure 110 in FIG. 1C is formed. Afterwards, the through via opening 123 is formed which penetrates the metal core 100 in the stacked structure 110. The through via opening 123 is formed by a laser drilling process or a mechanical drilling process, for example. Similarly, in the present embodiment, the through via opening 123 penetrates the core opening 102, and in the other embodiments not shown, the through via opening 123 may also penetrate the other positions in the metal core 100. Next, an electroplating process is performed at the both sides of the stacked structure 110 to form a conductive layer 128 on surfaces of the stacked structure 110 and the through via opening 123. A material of the conductive layer 128 is copper, for example. Afterwards, the through via opening 123 is filled with a via-filling material to form a via filler 130. A material of the via filler 130 is dielectric resin, for example.

Referring to FIG. 4B, the conductive layers 106 and 128 on surfaces of the dielectric layers 108 are removed to form a through via 132 connecting the conductive layers 106 respectively disposed at the both sides of the metal core 100. In another embodiment not illustrated herein, protrusions at both ends of the via filler 130 may also be removed by a mould-brushing process, for example.

The circuit board in the present invention either has the blind via 112 connecting the conductive layer 106 and the metal core 100 or has the through vias 126 and 132 connecting the conductive layers 106 at the both sides of the metal core 100. Furthermore, the circuit board may certainly have the blind via 112 and the through vias 126 and 132 simultaneously.

To sum up, in the present invention, the metal board is used as the core layer in the circuit board. Therefore, a circuit board having three circuit layers is formed by laminating the dielectric layers and the conductive layers respectively disposed at both sides of the metal core. In other words, the circuit board manufactured by the method of the present invention has an odd number of circuit layers and thereby preventing redundant circuit layers from being formed so as to reduce the manufacturing costs.

Although the present invention has been disclosed above by the embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. A circuit board, comprising:
 a stacked structure, comprising:
 a metal core;
 a pair of conductive layers, disposed at both sides of the metal core; and
 a dielectric layer, disposed between the corresponding conductive layer and the metal core, wherein the conductive layer is embedded in the corresponding dielectric layer; and
 a conductive via, disposed in the stacked structure to connect the corresponding conductive layer and the metal core and/or penetrating the metal core to connect the conductive layers disposed at the both sides of the metal core.

2. The circuit board as claimed in claim 1, wherein the conductive via comprises a blind via connecting the corresponding conductive layer and the metal core.

3. The circuit board as claimed in claim 1, wherein the conductive via comprises a through via, the through via penetrating the metal core to connect the pair of conductive layers at the both sides of the metal core.

4. The circuit board as claimed in claim 1, wherein a material of the metal core comprises metal or alloy.

5. The circuit board as claimed in claim 1, wherein a thickness of the metal core is between 0.02mm and 0.8mm.

6. The circuit board as claimed in claim 1, wherein a material of the conductive layer comprises copper.

7. The circuit board as claimed in claim 1, wherein a thickness of each of the pair of conductive layers is between 5 μm and 30 μm.

8. The circuit board as claimed in claim 1, wherein a material of the dielectric layer comprises dielectric resin.

9. The circuit board as claimed in claim 1, wherein a material of the conductive via comprises copper.

10. The circuit board as claimed in claim 1, wherein the metal core has a core opening penetrating the metal core and the conductive via penetrates the core opening.

* * * * *